(12) United States Patent
Li et al.

(10) Patent No.: US 11,428,613 B2
(45) Date of Patent: Aug. 30, 2022

(54) MECHANICAL RELIABILITY TESTING PLATFORM AND TESTING METHOD FOR TRI-POST INSULATORS IN GIL DEVICE

(71) Applicant: MAINTENANCE & TEST CENTRE, CSG EHV POWER TRANSMISSION COMPANY, Guangzhou (CN)

(72) Inventors: Weiguo Li, Guangzhou (CN); Changhong Zhang, Guangzhou (CN); Xu Yang, Guangzhou (CN); Zhongkang Huang, Guangzhou (CN); Jinwei Chu, Guangzhou (CN); Qi Wang, Guangzhou (CN)

(73) Assignee: MAINTENANCE & TEST CENTRE, CSG EHV POWER TRANSMISSION COMPANY, Guangzhou (CN)

( * ) Notice: Subject to any disclaimer, the term of this patent is extended or adjusted under 35 U.S.C. 154(b) by 312 days.

(21) Appl. No.: 16/623,403

(22) PCT Filed: May 29, 2019

(86) PCT No.: PCT/CN2019/088928
§ 371 (c)(1),
(2) Date: Dec. 17, 2019

(87) PCT Pub. No.: WO2019/237920
PCT Pub. Date: Dec. 19, 2019

(65) Prior Publication Data
US 2021/0356370 A1    Nov. 18, 2021

(30) Foreign Application Priority Data
Mar. 18, 2019   (CN) .......................... 201910205402.8

(51) Int. Cl.
*G01N 3/32* (2006.01)
*G01R 27/02* (2006.01)
(Continued)

(52) U.S. Cl.
CPC ........... *G01N 3/32* (2013.01); *G01R 31/1245* (2013.01); *G01N 2203/0005* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,743,709 A * | 5/1988 | Meyer | ................... | H02G 5/066 174/28 |
| 2012/0281332 A1* | 11/2012 | Kato | ..................... | H02G 5/065 361/226 |

FOREIGN PATENT DOCUMENTS

| | | |
|---|---|---|
| CA | 2858407 A1 | 7/2013 |
| CN | 108152693 A | 6/2018 |

(Continued)

*Primary Examiner* — Brandi N Hopkins
(74) *Attorney, Agent, or Firm* — Bayramoglu Law Offices LLC

(57) ABSTRACT

A mechanical reliability testing platform for tri-post insulators in a GIL device includes a horizontal-GIL-arrangement-form fixed-tri-post-insulator mechanical reliability verification testing platform for a horizontal dynamic insertion and extraction test, and a turning-GIL-arrangement-form fixed-tri-post-insulator mechanical reliability verification testing platform for a vertical dynamic insertion and extraction test. A driving unit is employed to realize the insertion and extraction of the conducting rod of the sliding-tri-post-insulator GIL form unit at the contact holder, so as to simulate the reciprocating forces on the fixed tri-post insulator induced by the thermal expansion and contraction of the pipe during the actual operation of the GIL, and simulate (Continued)

the working condition of the fixed tri-post insulator under abnormal forces when the GIL experience foundation settlement.

6 Claims, 1 Drawing Sheet

(51) Int. Cl.
 *G01M 13/00* (2019.01)
 *G01R 31/12* (2020.01)

(56) References Cited

FOREIGN PATENT DOCUMENTS

| | | | |
|---|---|---|---|
| CN | 207992375 U | 10/2018 | |
| EP | 0615131 A1 | 9/1994 | |
| JP | H09292434 A | 11/1997 | |

\* cited by examiner

MECHANICAL RELIABILITY TESTING PLATFORM AND TESTING METHOD FOR TRI-POST INSULATORS IN GIL DEVICE

CROSS-REFERENCES TO THE RELATED APPLICATIONS

This application is the national phase entry of International Application No. PCT/CN2019/088928, filed on May 29, 2019, which is based upon and claims priority to Chinese Patent Application No. 201910205402.8, filed on Mar. 18, 2019, the entire contents of which are incorporated herein by reference.

TECHNICAL FIELD

The present invention relates to the technical field of electronic devices, and particularly relates to a mechanical reliability testing platform and testing method for tri-post insulators in a GIL device.

BACKGROUND

In the actual operating conditions of the GIL (gas-insulated transmission lines) busbar, due to the influence of ambient temperature change, there will be a slight relative sliding between a conductor and a contact (on the order of millimeters or even below), and the relative motion between the conductor and the contact will produce reciprocating insertion and extraction forces at the contact portion. Due to the rigid connection between the conductor and a fixed tri-post insulator, the force of the continuous reciprocating motion may be transferred to the fixed tri-post insulator. In addition, due to the large length of GIL layout, GIL is susceptible to foundation settlement. At present, the GIL mechanical testing only involves the axial and radial static pressure testing of the tri-post insulator, but does not take into account the influence of the thermal expansion and contraction of the pipeline busbar and the foundation settlement on the life of the tri-post insulator.

SUMMARY

One object of the present invention is, in order to overcome the above technical deficiency, to provide a mechanical reliability testing platform and testing method for tri-post insulators in a GIL device.

The present invention is realized with the following technical solution: a mechanical reliability testing platform for tri-post insulators in a GIL device, comprises a horizontal-GIL-arrangement-form fixed-tri-post-insulator mechanical reliability verification testing platform for a horizontal dynamic insertion and extraction test, and a turning-GIL-arrangement-form fixed-tri-post-insulator mechanical reliability verification testing platform for a vertical dynamic insertion and extraction test.

The horizontal-GIL-arrangement-form fixed tri-post insulator mechanical reliability verification testing platform comprises a driving unit of which an output step duration and an operation interval are settable, a sliding-tri-post-insulator GIL form unit, and a fixed-tri-post-insulator GIL form unit; the sliding-tri-post-insulator GIL form unit comprises a first GIL housing, a first GIL conducting rod, a sliding tri-post insulator, and a corrugated pipe; the fixed-tri-post-insulator GIL form unit comprises a second GIL housing, a second GIL conducting rod, a fixed tri-post insulator, a disc insulator, a first contact holder, and a second contact holder; the first contact holder is disposed at one end of the second GIL conducting rod, and the second contact holder is disposed at one side of the disc insulator; the first GIL conducting rod is disposed inside the first GIL housing, one end of the first conducting rod is connected with the driving unit after passing through the sliding tri-post insulator, and the other end thereof is inserted into the first contact holder after passing through the corrugated pipe; the second GIL conducting rod is disposed inside the second GIL housing, one end of the second GIL conducting rod is connected with the first contact holder after passing through the fixed tri-post insulator, and the other end thereof is inserted into the second contact holder; the other side of the disc insulator is connectable to a testing unit for insulation test. With the horizontal-GIL-arrangement-form fixed-tri-post-insulator mechanical reliability verification testing platform, it is possible to carry out an insulation test to a horizontal GIL arrangement without disassembling the device.

The turning-GIL-arrangement-form fixed-tri-post-insulator mechanical reliability verification testing platform comprises a driving unit of which an output step duration and an operation interval are settable, a sliding-tri-post-insulator GIL form unit, a fixed-tri-post-insulator GIL form unit, and a three-way elbow; the sliding-tri-post-insulator GIL form unit comprises a first GIL housing, a first GIL conducting rod, a sliding tri-post insulator, and a corrugated pipe; the fixed-tri-post-insulator GIL form unit comprises a second GIL housing, a second GIL conducting rod, a fixed tri-post insulator, a disc insulator, a first contact holder, and a second contact holder; the first contact holder is disposed at one end of the three-way elbow, and the second contact holder is disposed at one side of the disc insulator; the first GIL conducting rod is disposed inside the first GIL housing, one end of the first conducting rod is connected with the driving unit after passing through the sliding tri-post insulator, and the other end thereof is inserted into the first contact holder after passing through the corrugated pipe; one end of the first GIL housing is connected with the three-way elbow; the second GIL conducting rod is disposed inside the second GIL housing, one end of the second GIL conducting rod is connected with the three-way elbow after passing through the fixed tri-post insulator, and the other end thereof is inserted into the second contact holder; the other side of the disc insulator is connectable to a testing unit for insulation test. With the turning-GIL-arrangement-form fixed-tri-post-insulator mechanical reliability verification testing platform, it is possible to carry out an insulation test to a turning GIL arrangement without disassembling the device.

The first GIL conducting rod and the corrugated pipe enable a deflection of ±3° at a connecting location.

A testing method based on the mechanical reliability testing platform for tri-post insulators in a GIL device, comprises the following steps:

step 1: performing a power-frequency voltage withstand test for the fixed tri-post insulator and the sliding tri-post insulator, wherein a testing voltage is 740 kV and a testing time is 1 minute;

step 2: performing a partial discharge measurement for the fixed tri-post insulator and the sliding tri-post insulator, wherein a testing voltage is 592 kV, and a partial discharge is required to be ≤3 pC;

step 3: performing an X-ray radiographic inspection for the fixed tri-post insulator and the sliding tri-post insulator;

step 4: assembling the mechanical reliability testing platform for the fixed tri-post insulator in a GIL device (excluding the driving unit), and performing a loop resistance test;

step 5: performing a standard lightning impulse test for the GIL device, wherein a testing voltage is 1,675 kV, a front time is 1.2 μs±30%, and a time to half-value is 50 μs±20%;

step 6: performing the power-frequency voltage withstand test for the GIL device, wherein the testing voltage is 740 kV and the testing time is 1 minute;

step 7: performing the partial discharge measurement for the GIL device, wherein the testing voltage is 592 kV, and the partial discharge is required to be ≤5 pC;

step 8: connecting the driving unit to the one end of the first conducting rod, and performing the dynamic insertion and extraction test; a deflection of ±3° at a connecting location is realized by the GIL conducting rod and the corrugated pipe; the test is performed with a deflection of +3° for 1,000 times, with a deflection of −3° for 1,000 times, and with a deflection of 0° for the remaining 13,000 times, totally 15,000 times; the testing frequency is 1 time/minute;

step 9: performing the loop resistance test for the GIL device, wherein a resistance change is ≤20%;

step 10: repeating the steps 5 to 7;

step 11: disassembling the GIL device, and repeating the steps 1 to 3.

Compared with the prior art, the advantages of the present invention are as follows: the platform allows evaluation of the influence of the reciprocating insertion and extraction forces induced by thermal expansion and contraction and the foundation settlement. The driving unit is employed to realize the insertion and extraction of the conducting rod (of the sliding-tri-post-insulator GIL form unit) at the contact holder, so as to simulate the reciprocating forces on the fixed tri-post insulator induced by the thermal expansion and contraction of the pipe during the actual operation of the GIL. Moreover, the working condition of the fixed tri-post insulator under abnormal forces when the GIL experience foundation settlement is also simulated. By employing the testing platform to carry out a reciprocating insertion and extraction mechanical test for 15,000 times and subsequently an insulation test, it is possible to effectively assess the influence of the thermal expansion and contraction of the GIL housing and the foundation settlement on the life of the fixed tri-post insulator, and accordingly provide rectification measures so as to effectively prevent the accelerated degradation of the insulating materials at the inserts of the fixed tri-post insulator.

Figure 1:
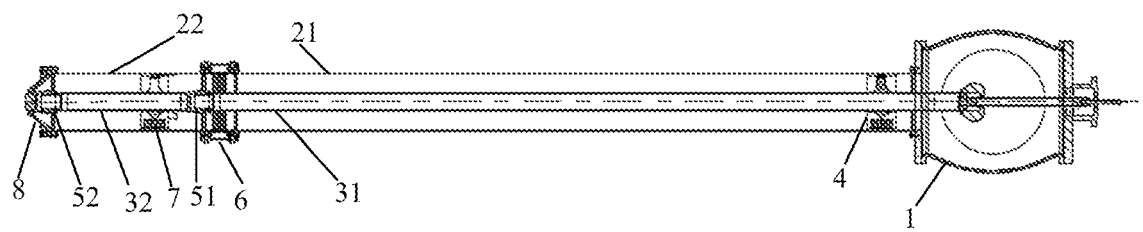
FIG. 1 is a schematic structural diagram of a horizontal-GIL-arrangement-form fixed-tri-post-insulator mechanical reliability verification testing platform of the present invention.

Reference signs in the drawings: 1: driving unit; 21: first GIL housing; 22: second GIL housing; 31: first GIL conducting rod; 32: second GIL conducting rod; 4: sliding tri-post insulator; 51: first contact holder; 52: second contact holder; 6: corrugated pipe; 7: fixed tri-post insulator; 8: disc insulator; 9: three-way elbow.

DETAILED DESCRIPTION OF THE EMBODIMENTS

The content of the present invention will be further described in detail below with reference to the drawings and embodiments.

Embodiments

Figure 2:
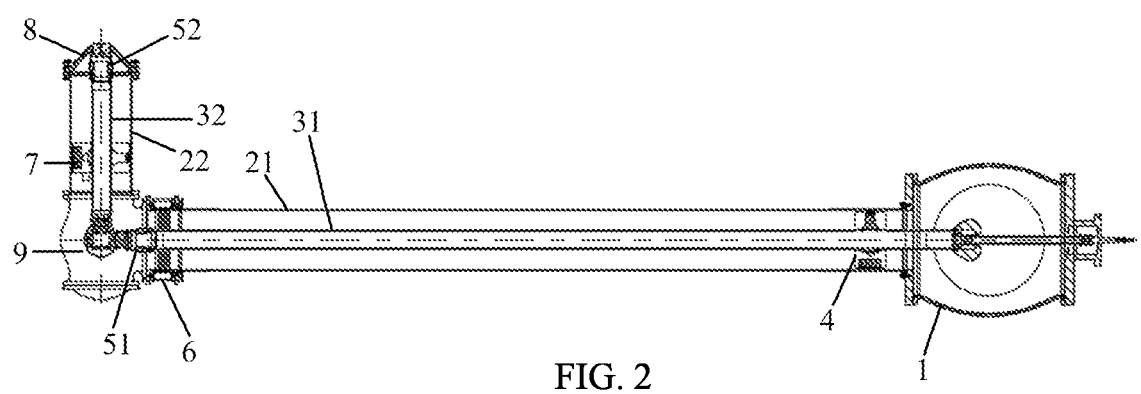
FIG. 2 is a schematic structural diagram of a turning-GIL-arrangement-form fixed-tri-post-insulator mechanical reliability verification testing platform of the present invention.

As shown in FIG. 1 and FIG. 2 is a mechanical reliability testing platform for tri-post insulators in a GIL device, comprising a horizontal-GIL-arrangement-form fixed-tri-post-insulator 7 mechanical reliability verification testing platform for a horizontal dynamic insertion and extraction test, and a turning-GIL-arrangement-form fixed-tri-post-insulator 7 mechanical reliability verification testing platform for a vertical dynamic insertion and extraction test.

The horizontal-GIL-arrangement-form fixed tri-post insulator 7 mechanical reliability verification testing platform comprises a driving unit 1 of which an output step duration and an operation interval are settable, a sliding-tri-post-insulator GIL form unit, and a fixed-tri-post-insulator 7 GIL form unit; the sliding-tri-post-insulator GIL form unit comprises a first GIL housing 21, a first GIL conducting rod 31, a sliding tri-post insulator 4, and a corrugated pipe 6; the fixed-tri-post-insulator 7 GIL form unit comprises a second GIL housing 22, a second GIL conducting rod 32, a fixed tri-post insulator 7, a disc insulator 8, a first contact holder 51, and a second contact holder 52; the first contact holder 51 is disposed at one end of the second GIL conducting rod 32, and the second contact holder 52 is disposed at one side of the disc insulator 8; the first GIL conducting rod 31 is disposed inside the first GIL housing 21, one end of the first conducting rod 31 is connected with the driving unit 1 after passing through the sliding tri-post insulator 4, and the other end thereof is inserted into the first contact holder 51 after passing through the corrugated pipe 6; the second GIL conducting rod 32 is disposed inside the second GIL housing 22, one end of the second GIL conducting rod 32 is connected with the first contact holder 51 after passing through the fixed tri-post insulator 7, and the other end thereof is inserted into the second contact holder 52; the other side of the disc insulator 8 is connectable to a testing unit for insulation test. With the horizontal-GIL-arrangement-form fixed-tri-post-insulator 7 mechanical reliability verification testing platform, it is possible to carry out an insulation test to a horizontal GIL arrangement without disassembling the device.

The turning-GIL-arrangement-form fixed-tri-post-insulator 7 mechanical reliability verification testing platform comprises a driving unit 1 of which an output step duration and an operation interval are settable, a sliding-tri-post-insulator GIL form unit, a fixed-tri-post-insulator 7 GIL form unit, and a three-way elbow 9; the sliding-tri-post-insulator GIL form unit comprises a first GIL housing 21, a first GIL conducting rod 31, a sliding tri-post insulator 4, and a corrugated pipe 6; the fixed-tri-post-insulator 7 GIL form unit comprises a second GIL housing 22, a second GIL conducting rod 32, a fixed tri-post insulator 7, a disc insulator 8, a first contact holder 51, and a second contact holder 52; the first contact holder 51 is disposed at one end of the three-way elbow 9, and the second contact holder 52 is disposed at one side of the disc insulator 8; the first GIL conducting rod 31 is disposed inside the first GIL housing 21, one end of the first conducting rod 31 is connected with the driving unit 1 after passing through the sliding tri-post insulator 4, and the other end thereof is inserted into the first contact holder 51 after passing through the corrugated pipe 6; one end of the first GIL housing 21 is connected with the three-way elbow 9; the second GIL conducting rod 32 is disposed inside the second GIL housing 22, one end of the second GIL conducting rod 32 is connected with the three-way elbow 9 after passing through the fixed tri-post insulator 7, and the other end thereof is inserted into the second contact holder 52; the other side of the disc insulator 8 is connectable to a testing unit for insulation test. With the turning-GIL-arrangement-form fixed-tri-post-insulator 7 mechanical reliability verification testing platform, it is possible to carry out an insulation test to a turning GIL arrangement without disassembling the device.

The first GIL conducting rod 31 and the corrugated pipe 6 enable a deflection of ±3° at a connecting location.

A testing method based on the mechanical reliability testing platform for tri-post insulators in a GIL device, comprises the following steps:

step 1: performing a power-frequency voltage withstand test for the fixed tri-post insulator 7 and the sliding tri-post insulator 4, wherein a testing voltage is 740 kV and a testing time is 1 minute;

step 2: performing a partial discharge measurement for the fixed tri-post insulator 7 and the sliding tri-post insulator 4, wherein a testing voltage is 592 kV, and a partial discharge is required to be ≤3 pC;

step 3: performing an X-ray radiographic inspection for the fixed tri-post insulator 7 and the sliding tri-post insulator 4;

step 4: assembling the mechanical reliability testing platform for the fixed tri-post insulator 7 in a GIL device (excluding the driving unit), and performing a loop resistance test;

step 5: performing a standard lightning impulse test for the GIL device, wherein a testing voltage is 1,675 kV, a front time is 1.2 μs±30%, and a time to half-value is 50 μs±20%;

step 6: performing the power-frequency voltage withstand test for the GIL device, wherein the testing voltage is 740 kV and the testing time is 1 minute;

step 7: performing the partial discharge measurement for the GIL device, wherein the testing voltage is 592 kV, and the partial discharge is required to be ≤5 pC;

step 8: connecting the driving unit 1 to the one end of the first conducting rod 31, and performing the dynamic insertion and extraction test; a deflection of ±3° at a connecting location is realized by the GIL conducting rod and the corrugated pipe; the test is performed with a deflection of +3° for 1,000 times, with a deflection of −3° for 1,000 times, and with a deflection of 0° for the remaining 13,000 times, totally 15,000 times; the testing frequency is 1 time/minute;

step 9: performing the loop resistance test for the GIL device, wherein a resistance change is ≤20%;

step 10: repeating the steps 5 to 7;

step 11: disassembling the GIL device, and repeating the steps 1 to 3.

The present embodiment is a mechanical reliability verification test scheme applied to a 550 kV GIL device.

In the actual operating conditions of the busbar, due to the influence of ambient temperature change, a slight relative sliding between a conductor and a contact will actually occur (on the order of millimeters or even below), and the relative motion between the conductor and the contact will produce continuous insertion and extraction forces at the contact portion. It is estimated that, the insertion and extraction forces does not exceed 1400 N for a contact. Due to the rigid connection between the conductor and the tri-post insulator, the force of the continuous reciprocating motion may be transferred to the fixed tri-post insulator 7. In order to evaluate the influence of the continuous reciprocating forces on the tri-post insulator, the present test scheme is designed for simulation.

The items to be verified in this test include:

(1) To verify the influence of the foundation settlement and the housing transformation on the fixed tri-post insulator;

(2) To verify the contact reliability of the connection between the contact and the conductor;

(3) To verify the strength of the inserts at the ground potential side of the fixed tri-post insulator, and the reliability of the weld between the connection plate and the housing.

The test is designed to be applied to the following two operating conditions.

(1) Horizontal arrangement form: The form unit consists of (as shown in FIG. 1), a form having the disc insulator 8, the fixed tri-post insulator 7 and the corrugated pipe 6, and a 6-meter form having the sliding tri-post insulator 4. The driving unit 1 is adopted to drive the motion of the contact. A deflection of ±3° at a connecting location of the contact is realized by adjusting the corrugated pipe 6 as shown in FIG. 1. The test is performed with a deflection of +3° for 1,000 times, with a deflection of −3° for 1,000 times, and with a deflection of 0° for the remaining 13,000 times, totally 15,000 times; the testing frequency is 1 time/minute. See Table 1 for detailed testing items.

(2) Turning arrangement form: The form unit consists of (as shown in FIG. 2), a form having the disc insulator 8, the fixed tri-post insulator 7, the three-way elbow 9 and the corrugated pipe 6, and a 6-meter form having the sliding tri-post insulator 4. The driving unit 1 is adopted to drive the motion of the contact. A deflection of ±3° at a connecting location of the contact is realized by adjusting the corrugated pipe 6 as shown in FIG. 2. The test is performed with a deflection of +3° for 1,000 times, with a deflection of −3° for 1,000 times, and with a deflection of 0° for the remaining 13,000 times, totally 15,000 times; the testing frequency is 1 time/minute. See Table 1 for detailed testing items.

TABLE 1

| | Testing Items | |
| --- | --- | --- |
| No. | Testing item | Parameters and standards |
| 1 | Insulation test of the tri-post insulator | X-ray radiographic inspection Power-frequency, 740 kV/1 min Partial discharge ≤ 3 pC |
| 2 | Resistance measurement in the testing form | Complying with those of the sample |
| 3 | Insulation test in the testing form | Lightning, 1,675 kV Power-frequency, 740 kV/1 min Partial discharge ≤ 5 pC |
| 4 | Mechanical reliability test | 1,5000 times |
| 5 | Resistance measurement in the testing form | Resistance change does not exceed 20% after the mechanical test. |
| 6 | Insulation test in the testing form | Lightning, 1,675 kV Power-frequency, 740 kV/1 min Partial discharge ≤ 5 pC |
| 7 | Inspection after disassembling the device | X-ray radiographic inspection Power-frequency, 740 kV/1 min Partial discharge ≤ 3 pC |

The detailed description above is a specific description of feasible embodiments of the present invention, while these embodiments are not intended to limit the scope of the present invention. Any equivalent implementation or change without departing from the scope of the present invention should be included in the scope of the claimed invention.

What is claimed is:

1. A mechanical reliability testing platform for tri-post insulators in a GIL device, comprising:
    a horizontal-GIL-arrangement-form fixed-tri-post-insulator mechanical reliability verification testing platform for a horizontal dynamic insertion and extraction test, or
    a turning-GIL-arrangement-form fixed-tri-post-insulator mechanical reliability verification testing platform for a vertical dynamic insertion and extraction test;
    wherein
    when the mechanical reliability testing platform is the horizontal-GIL-arrangement-form fixed-tri-post-insulator mechanical reliability verification testing platform, the horizontal-GIL-arrangement-form fixed-tri-post-insulator mechanical reliability verification testing platform comprises a driving unit wherein an output step duration and an operation interval are settable, a sliding-tri-post-insulator GIL form unit, and a fixed-tri-post-insulator GIL form unit;

the sliding-tri-post-insulator GIL form unit comprises a first GIL housing, a first GIL conducting rod, a sliding tri-post insulator, and a corrugated pipe;

the fixed-tri-post-insulator GIL form unit comprises a second GIL housing, a second GIL conducting rod, a fixed tri-post insulator, a disc insulator, a first contact holder, and a second contact holder;

the first contact holder is disposed at one end of the second GIL conducting rod, and the second contact holder is disposed at one side of the disc insulator;

the first GIL conducting rod is disposed inside the first GIL housing, one end of the first conducting rod is connected with the driving unit after passing through the sliding tri-post insulator, and another end of the first conducting rod is inserted into the first contact holder after passing through the corrugated pipe;

the second GIL conducting rod is disposed inside the second GIL housing, one end of the second GIL conducting rod is connected with the first contact holder after passing through the fixed tri-post insulator, and another end of the second GIL conducting rod is inserted into the second contact holder; another side of the disc insulator is connectable to a testing unit for an insulation test.

2. The mechanical reliability testing platform according to claim 1, wherein
the first GIL conducting rod and the corrugated pipe enable a deflection of ±3° at a connecting location.

3. A testing method using the mechanical reliability testing platform of claim 1, comprising the following steps:
step 1: performing a power-frequency voltage withstand test for the fixed tri-post insulator and the sliding tri-post insulator, wherein a testing voltage is 740 kV and a testing time is 1 minute;
step 2: performing a partial discharge measurement for the fixed tri-post insulator and the sliding tri-post insulator, wherein a testing voltage is 592 kV, and a partial discharge is required to be ≤3 pC;
step 3: performing an X-ray radiographic inspection for the fixed tri-post insulator and the sliding tri-post insulator;
step 4: assembling the mechanical reliability testing platform for the fixed tri-post insulator in the GIL device excluding the driving unit, and performing a loop resistance test;
step 5: performing a standard lightning impulse test for the GIL device, wherein a testing voltage is 1,675 kV, a front time is 1.2 μs±30%, and a time to half-value is 50 μs±20%;
step 6: performing the power-frequency voltage withstand test for the GIL device, wherein the testing voltage is 740 kV and the testing time is 1 minute;
step 7: performing the partial discharge measurement for the GIL device, wherein the testing voltage is 592 kV, and the partial discharge is required to be ≤5 pC;
step 8: connecting the driving unit to the one end of the first conducting rod, and performing a dynamic insertion and extraction test; a deflection of ±3° at a connecting location is realized by the GIL conducting rod and the corrugated pipe; the dynamic insertion and extraction test is performed with a deflection of +3° for 1,000 times, with a deflection of −3° for 1,000 times, and with a deflection of 0° for remaining 13,000 times, totally 15,000 times; a testing frequency is 1 time/minute;
step 9: performing the loop resistance test for the GIL device, wherein a resistance change is ≤20%;
step 10: repeating the steps 5 to 7;
step 11: disassembling the GIL device, and repeating the steps 1 to 3.

4. A mechanical reliability testing platform for tri-post insulators in a GIL device, comprising:
a horizontal-GIL-arrangement-form fixed-tri-post-insulator mechanical reliability verification testing platform for a horizontal dynamic insertion and extraction test, or
a turning-GIL-arrangement-form fixed-tri-post-insulator mechanical reliability verification testing platform for a vertical dynamic insertion and extraction test;
wherein
when the mechanical reliability testing platform is the turning-GIL-arrangement-form fixed-tri-post-insulator mechanical reliability verification testing platform,
the turning-GIL-arrangement-form fixed-tri-post-insulator mechanical reliability verification testing platform comprises a driving unit wherein an output step duration and an operation interval are settable, a sliding-tri-post-insulator GIL form unit, a fixed-tri-post-insulator GIL form unit, and a three-way elbow;
the sliding-tri-post-insulator GIL form unit comprises a first GIL housing, a first GIL conducting rod, a sliding tri-post insulator, and a corrugated pipe;
the fixed-tri-post-insulator GIL form unit comprises a second GIL housing, a second GIL conducting rod, a fixed tri-post insulator, a disc insulator, a first contact holder, and a second contact holder;
the first contact holder is disposed at one end of the three-way elbow, and the second contact holder is disposed at one side of the disc insulator;
the first GIL conducting rod is disposed inside the first GIL housing, one end of the first conducting rod is connected with the driving unit after passing through the sliding tri-post insulator, and another end of the first conducting rod is inserted into the first contact holder after passing through the corrugated pipe; one end of the first GIL housing is connected with the three-way elbow;
the second GIL conducting rod is disposed inside the second GIL housing, one end of the second GIL conducting rod is connected with the three-way elbow after passing through the fixed tri-post insulator, and another end of the second GIL conducting rod is inserted into the second contact holder; another side of the disc insulator is connectable to a testing unit for an insulation test.

5. The mechanical reliability testing platform according to claim 4, wherein
the first GIL conducting rod and the corrugated pipe enable a deflection of ±3° at a connecting location.

6. A testing method using the mechanical reliability testing platform of claim 4, comprising the following steps:
step 1: performing a power-frequency voltage withstand test for the fixed tri-post insulator and the sliding tri-post insulator, wherein a testing voltage is 740 kV and a testing time is 1 minute;
step 2: performing a partial discharge measurement for the fixed tri-post insulator and the sliding tri-post insulator, wherein a testing voltage is 592 kV, and a partial discharge is required to be ≤3 pC;

step 3: performing an X-ray radiographic inspection for the fixed tri-post insulator and the sliding tri-post insulator;

step 4: assembling the mechanical reliability testing platform for the fixed tri-post insulator in the GIL device excluding the driving unit, and performing a loop resistance test;

step 5: performing a standard lightning impulse test for the GIL device, wherein a testing voltage is 1,675 kV, a front time is 1.2 μs±30%, and a time to half-value is 50 μs±20%;

step 6: performing the power-frequency voltage withstand test for the GIL device, wherein the testing voltage is 740 kV and the testing time is 1 minute;

step 7: performing the partial discharge measurement for the GIL device, wherein the testing voltage is 592 kV, and the partial discharge is required to be ≤5 pC;

step 8: connecting the driving unit to the one end of the first conducting rod, and performing a dynamic insertion and extraction test; a deflection of ±3° at a connecting location is realized by the GIL conducting rod and the corrugated pipe; the dynamic insertion and extraction test is performed with a deflection of +3° for 1,000 times, with a deflection of −3° for 1,000 times, and with a deflection of 0° for remaining 13,000 times, totally 15,000 times; a testing frequency is 1 time/minute;

step 9: performing the loop resistance test for the GIL device, wherein a resistance change is ≤20%;

step 10: repeating the steps 5 to 7;

step 11: disassembling the GIL device, and repeating the steps 1 to 3.

* * * * *